United States Patent
Ogawa et al.

(10) Patent No.: US 11,473,194 B2
(45) Date of Patent: Oct. 18, 2022

(54) CLEANING METHOD OF DEPOSITION APPARATUS

(71) Applicant: Tokyo Electron Limited, Tokyo (JP)

(72) Inventors: Jun Ogawa, Yamanashi (JP); Hiroyuki Wada, Yamanashi (JP); Akihiro Kuribayashi, Yamanashi (JP); Takeshi Oyama, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 266 days.

(21) Appl. No.: 16/815,181

(22) Filed: Mar. 11, 2020

(65) Prior Publication Data

US 2020/0299835 A1    Sep. 24, 2020

(30) Foreign Application Priority Data

Mar. 19, 2019   (JP) .............................. JP2019-051763

(51) Int. Cl.
*C23C 16/44* (2006.01)
*C23C 16/34* (2006.01)

(52) U.S. Cl.
CPC ........ *C23C 16/4405* (2013.01); *C23C 16/345* (2013.01)

(58) Field of Classification Search
None
See application file for complete search history.

(56) References Cited

U.S. PATENT DOCUMENTS

| 6,067,999 A * | 5/2000 | Hines ................. C23C 16/4405 134/1 |
| 2006/0228473 A1* | 10/2006 | Satoh ..................... C23C 16/52 134/1.2 |
| 2018/0355479 A1* | 12/2018 | Karakawa ......... H01L 21/68764 |

FOREIGN PATENT DOCUMENTS

| JP | 2017-175106 | 9/2017 | |
| WO | WO-2016043221 A1 * | 3/2016 | ............. C23C 16/44 |

OTHER PUBLICATIONS

WO-2016043221-A1 English Translation, accessed on Feb. 2022. (Year: 2016).*

* cited by examiner

*Primary Examiner* — Eric W Golightly
*Assistant Examiner* — Arlyn I Rivera-Cordero
(74) *Attorney, Agent, or Firm* — IPUSA, PLLC

(57) ABSTRACT

A method of cleaning a deposition apparatus is provided. The method includes cleaning, with a cleaning gas formed into a plasma, an interior of a processing vessel on which a silicon nitride film is deposited. The cleaning gas includes a fluorine-containing gas and oxygen gas.

9 Claims, 12 Drawing Sheets

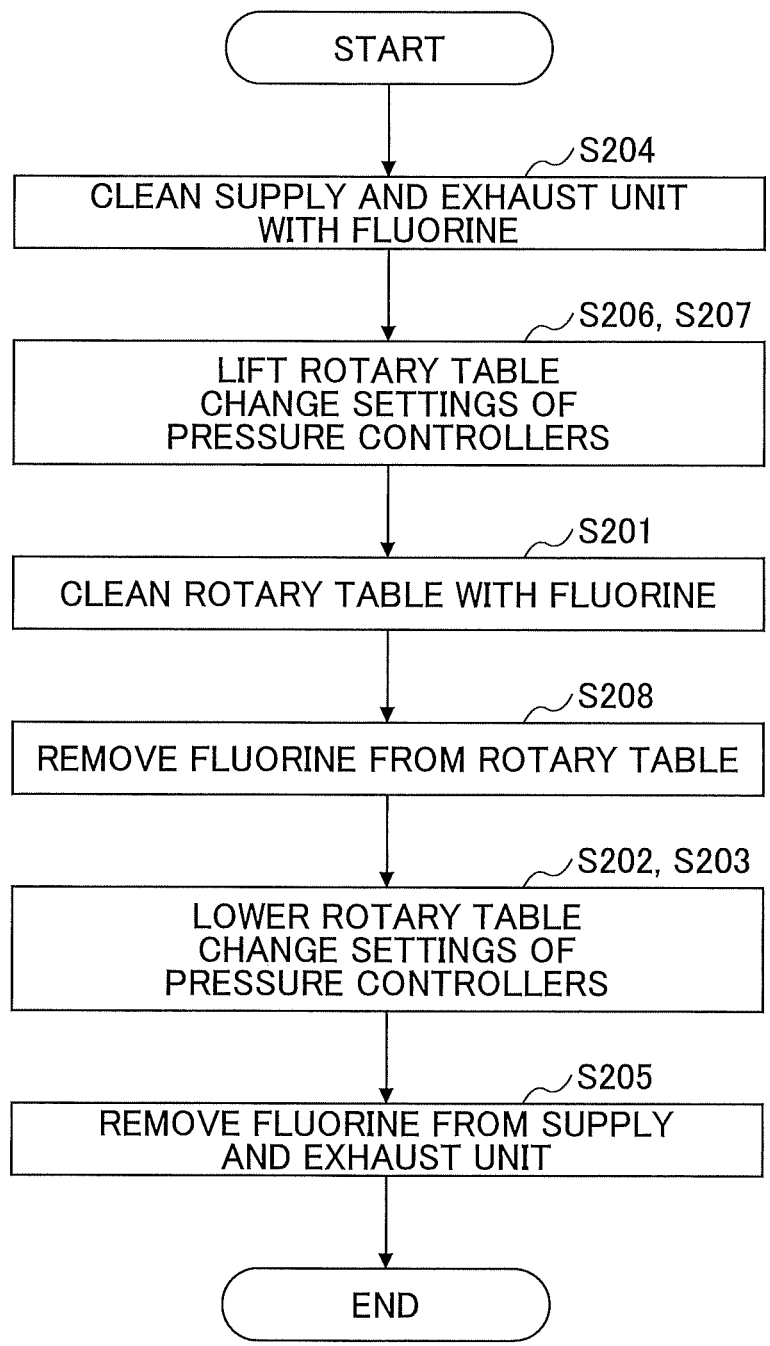

CLEANING METHOD OF DEPOSITION APPARATUS

CROSS-REFERENCE TO RELATED APPLICATIONS

This patent application is based upon and claims priority to Japanese Patent Application No. 2019-051763 filed on Mar. 19, 2019, the entire contents of which are incorporated herein by reference.

TECHNICAL FIELD

The present disclosure relates to a method for cleaning a deposition apparatus.

BACKGROUND

Patent Document 1 describes an atomic layer deposition (ALD) method in which reaction products are deposited onto a substrate by alternately supplying at least two types of reaction gases that react with each other to the substrate. In Patent Document 1, substrates disposed horizontally around a rotational center of a rotary table are rotated together with the rotary table, to convey the substrates to a first processing region, a second processing region, a third processing region, and a fourth processing region. In the first processing region, a silicon-containing gas (e.g., dichlorosilane gas) is fed to the substrate, the silicon-containing gas is adsorbed to the substrate, and a silicon-containing layer is formed on the substrate. In the second to fourth processing regions, a nitriding gas (e.g., a mixture of ammonia gas and hydrogen gas) is supplied to the substrate.

The nitriding gas is formed into plasma, and nitrides the silicon-containing layer. As a result, a silicon nitride film is formed.

CITATION LIST

Patent Document

[Patent Document 1] Japanese Laid-open Patent Application Publication No. 2017-175106

SUMMARY

One aspect of the present disclosure provides a technique for efficiently removing silicon nitride films deposited within a processing vessel and for suppressing damage to members formed of quartz.

A method of cleaning a deposition apparatus according to one embodiment of the present disclosure includes cleaning, with a cleaning gas formed into a plasma, the interior of a processing vessel on which a silicon nitride film is deposited. The cleaning gas includes a fluorine-containing gas and oxygen gas.

BRIEF DESCRIPTION OF THE DRAWINGS

FIG. 12 is a flowchart illustrating a cleaning method according to a modified embodiment.

DETAILED DESCRIPTION OF EMBODIMENTS

Figure 1:
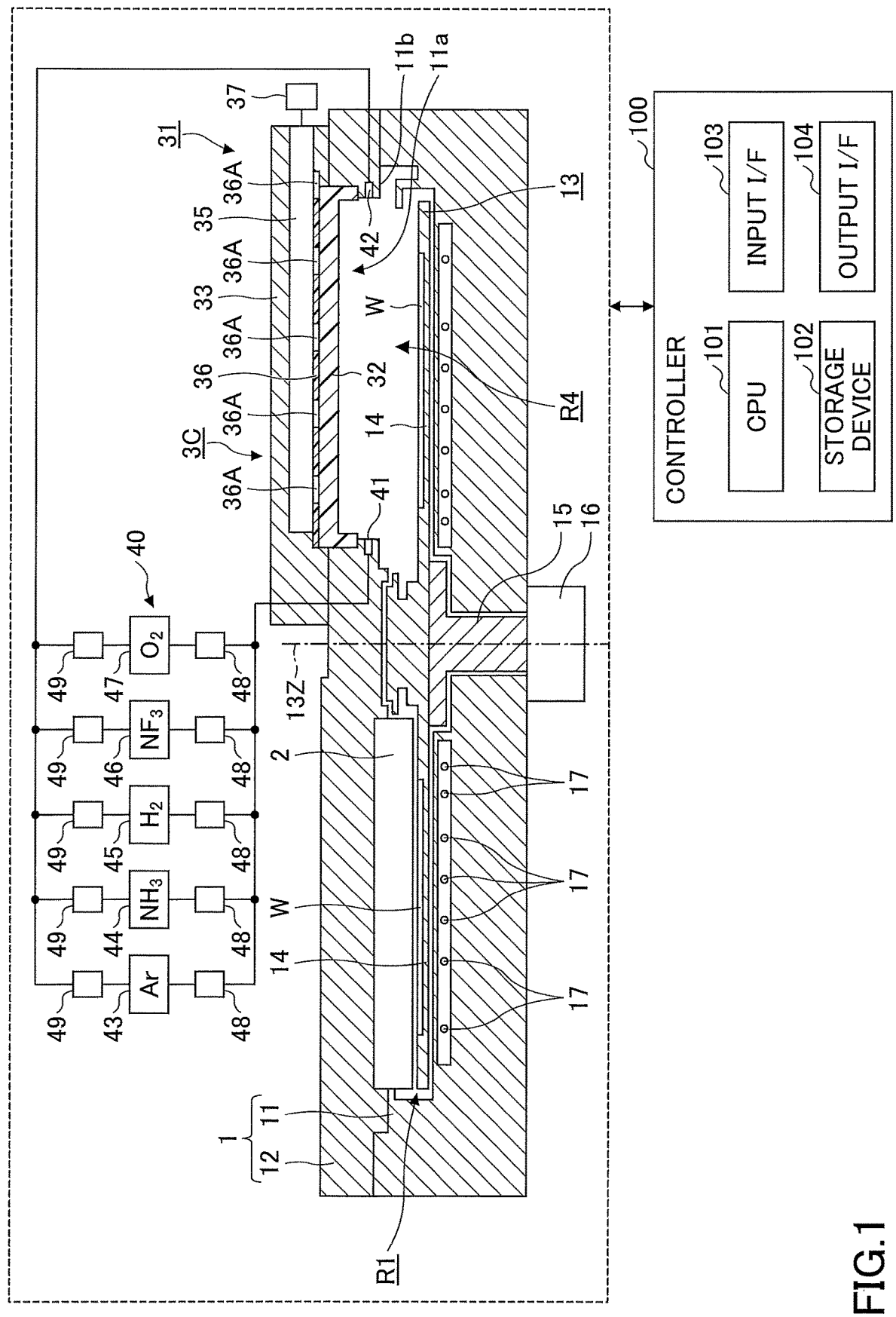
FIG. 1 is a cross-sectional view of a deposition apparatus according to an embodiment.

Hereinafter, embodiments of the present disclosure will be described with reference to the drawings. In each drawing, the same or corresponding structures are indicated by the same or corresponding reference numerals and the description thereof may be omitted.

(Deposition Apparatus)

Figure 2:
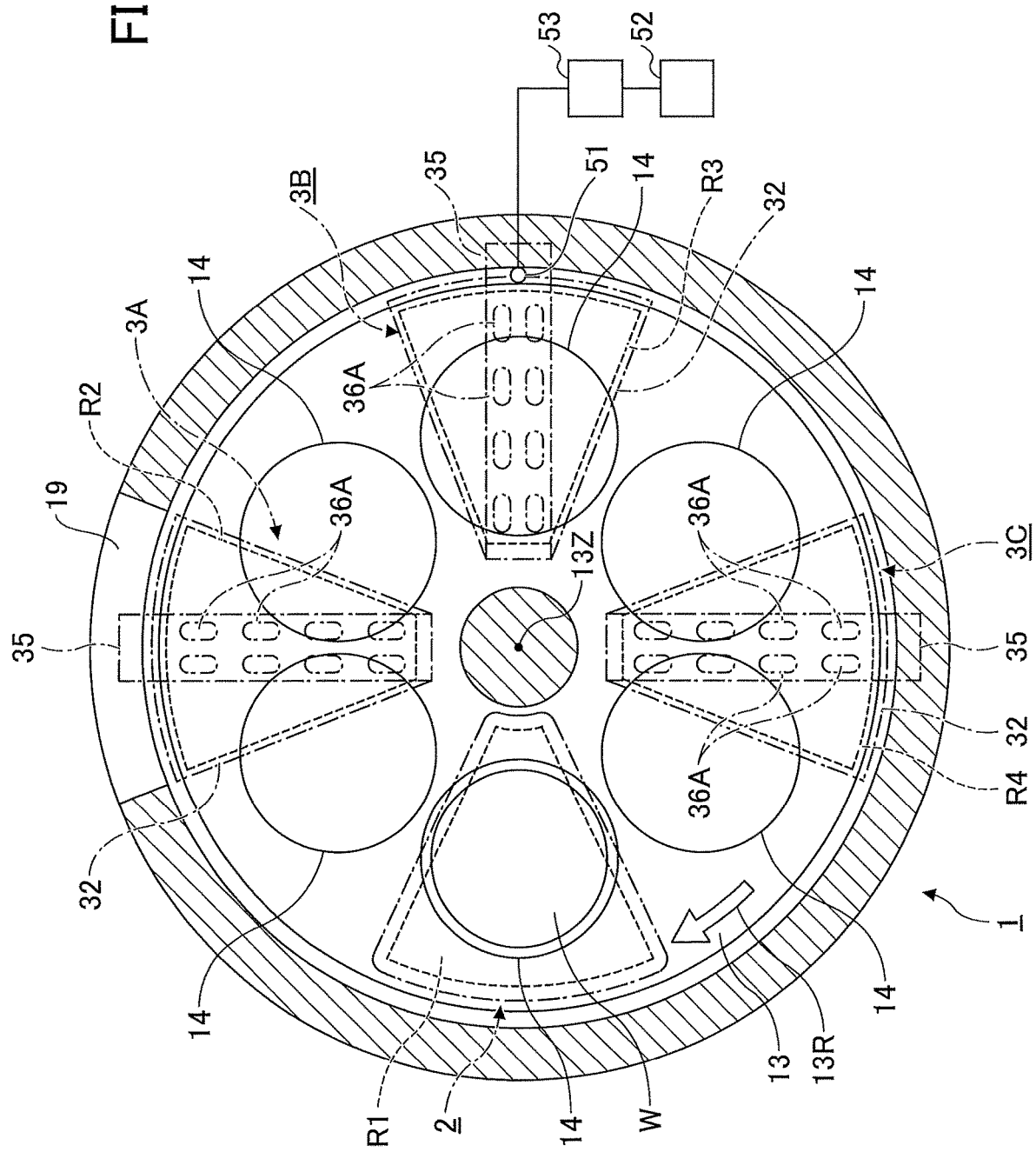
FIG. 2 is a plan view illustrating an internal structure of a processing vessel according to the embodiment.

FIG. 1 is a cross-sectional view of a deposition apparatus according to an embodiment. FIG. 2 is a plan view illustrating the internal structure of a processing vessel according to the present embodiment.

In the deposition apparatus, a film is formed on a substrate W by the atomic layer deposition (ALD) method. The substrate W is a semiconductor substrate such as a silicon wafer. The substrate W may include an undercoat film. An example of the film formed by the deposition apparatus includes a silicon nitride film. The silicon nitride film is formed on the substrate W by alternately supplying a raw material gas (e.g., dichlorosilane gas) and a gas for nitriding (e.g., ammonia gas) to the substrate W.

The deposition apparatus includes a flat processing vessel 1 having a substantially circular planar shape, and a rotary table 13 disposed in the processing vessel 1. The rotary table 13 has a rotational center (may also be referred to as a "rotational center line") 13Z at the center of the processing vessel 1. The processing vessel 1 includes a vessel body 11 having a cylindrical shape with a bottom, and a removable top plate 12 that is hermetically attached to a top surface of the vessel body 11.

On a side wall of the processing vessel 1, as illustrated in FIG. 2, a conveying port 19 of the substrate W is formed. An external transfer arm passes through the conveying port 19 and stands by above the rotary table 13. On an upper surface of the rotary table 13, multiple (e.g., six) recesses 14 are provided around the rotational center line 13Z of the rotary table 13. Each of the recesses 14 is formed in a circular shape. A diameter of each of the recesses 14 is greater than a diameter of the substrate W. The substrate W is placed horizontally on an inner bottom surface of the recess 14. An upper surface of the substrate W placed in the recess 14 and the upper surface of the rotary table 13 are at the same level. Three pin holes are formed on the inner bottom surface of the recess 14, and a lift pin is provided at a position of each of the three pin holes. The three lift pins pass the substrate W between the transfer arm and the rotary table 13 by raising and lowering the substrate W while supporting the substrate W from below. The conveying port 19 is opened and closed by a gate valve.

As illustrated in FIG. 1, the rotary table 13 is fixed to an upper end of a rotating shaft at the center of the rotary table 13. The rotating shaft 15 extends downward vertically, passes through the bottom of the processing vessel 1, and is connected to an actuator 16. When the actuator 16 rotates the rotary table 13, the recesses 14 rotate about the rotational center line 13Z of the rotary table 13, and the substrate W placed in the recess 14 rotates. The actuator 16 also functions to raise and lower the rotary table 13. Lowering the rotary table 13 widens a gap between the rotary table 13 and the top plate 12, thereby allowing the transfer arm to easily enter between the rotary table 13 and the top plate 12.

A heater 17 is provided below the rotary table 13. The heater 17 heats the substrate W on the rotary table 13 by heating the rotary table 13. The heater 17 is arranged concentrically at the bottom of the processing vessel 1 so that the entire substrate W can be heated.

A supply and exhaust unit 2, a plasma forming unit 3A, a plasma forming unit 3B, and a plasma forming unit 3C are arranged above the rotary table 13 in this order in a rotating direction 13R of the rotary table 13, as illustrated in FIG. 2. The substrate W rotating with the rotary table 13 passes through a first processing region R1, a second processing region R2, a third processing region R3, and a fourth processing region R4 in this order.

The first processing region R1 is formed below the supply and exhaust unit 2. In the first processing region R1, the raw material gas is adsorbed to the substrate W. In a case in which a silicon nitride film is formed by the deposition apparatus, a silicon-containing gas is used as a raw material gas. By adsorption of the silicon-containing gas to the substrate W, a silicon-containing layer is formed on the substrate W. The silicon-containing layer includes halogens in addition to silicon. This is because the raw material gas contains halogens.

The second processing region R2 is formed below the plasma forming unit 3A. The third processing region R3 is formed below the plasma forming unit 3B. In the second processing region R2 and the third processing region R3, the silicon-containing layer is refined with a refining gas formed into a plasma (a plasma formed from a refining gas). Refinement of the silicon-containing layer includes, for example, removing halogens contained in the silicon-containing layer. By removing halogens, dangling bonds on Si can be formed. As a result, the silicon-containing layer can be activated and the nitriding of the silicon-containing layer can be promoted. The refining gas includes, for example, hydrogen ($H_2$) gas. The refining gas may include argon (Ar) gas in addition to hydrogen gas.

The fourth processing region R4 is formed below the plasma forming unit 3C. In the fourth processing region R4, a silicon nitride film is formed because the silicon-containing layer is nitrided with a nitriding gas formed into a plasma. For example, ammonia ($NH_3$) gas or nitrogen ($N_2$) gas may be used as the nitriding gas.

Figure 3:
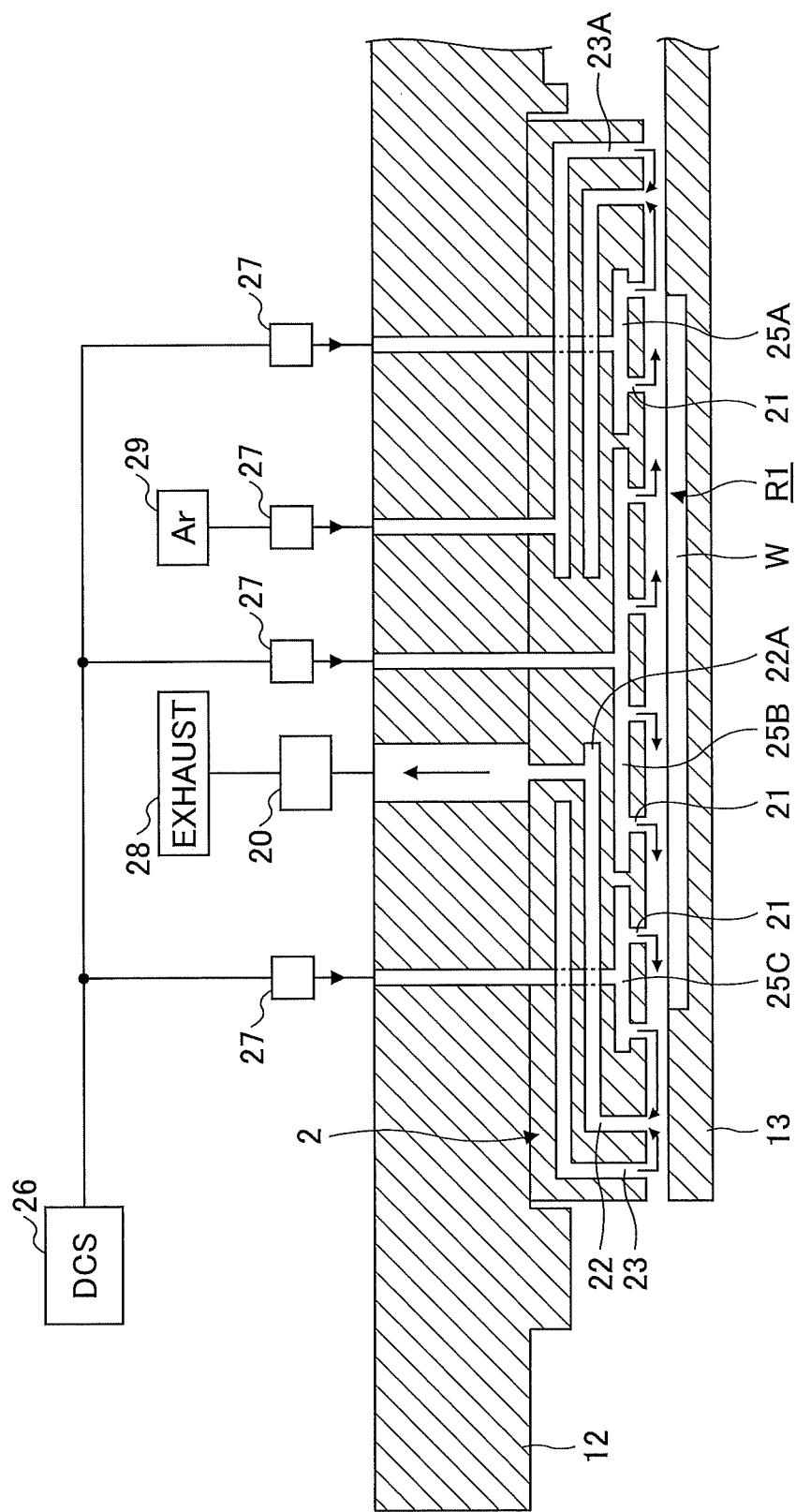
FIG. 3 is a cross-sectional view of a supply and exhaust unit according to the embodiment.
Figure 4:
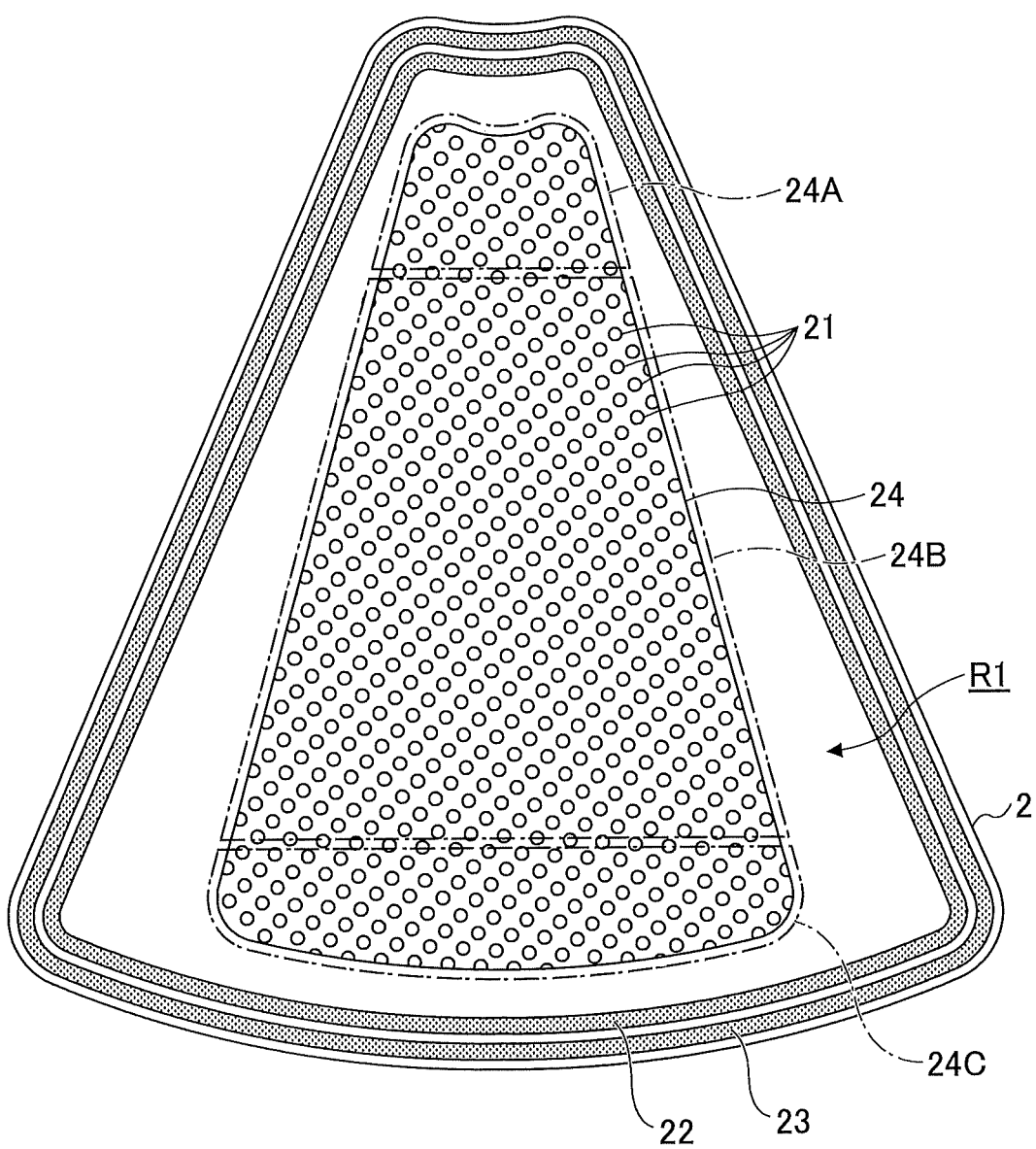
FIG. 4 is a plan view of the supply and exhaust unit according to the embodiment.

FIG. 3 is a cross-sectional view of the supply and exhaust unit according to the present embodiment. FIG. 4 is a plan view of the supply and exhaust unit according to the present embodiment. In FIG. 4, an exhaust port 22 and a purge gas outlet 23 are illustrated using dotted patterns to improve discrimination on the drawings.

As illustrated in FIG. 4, the supply and exhaust unit 2 is formed in a shape of a fan in a planar view. The supply and exhaust unit 2 expands gradually in a circumferential direction of the rotary table 13 as approaching an edge of the supply and exhaust unit 2 in a radial direction. A lower surface of the supply and exhaust unit 2 is arranged parallel to the upper surface of the rotary table 13.

Gas outlet holes 21, the exhaust port 22, and the purge gas outlet 23 are formed on the lower surface of the supply and exhaust unit 2. The multiple gas outlet holes 21 are disposed in a fan-shaped region 24. The fan-shaped region 24 expands gradually in a circumferential direction of the rotary table 13 as approaching an edge of the fan-shaped region 24 in a radial direction. The multiple gas outlet holes 21 discharge the raw material gas like a shower during deposition processing, and supply the raw material gas to an entire surface of the substrate W. In a case in which a silicon nitride film is formed by the deposition apparatus, a silicon-containing gas is used as the raw material gas.

For example, dichlorosilane (DCS: $SiH_2Cl_2$) gas may be used as the silicon-containing gas. Although an example of the raw material gas according to the present embodiment is DCS gas, a technique according to the present disclosure is not limited thereto. For example, monochlorosilane (MCS: $SiH_3Cl$), trichlorosilane (TCS: $SiHCl_3$) gas, silicon tetrachloride (STC: $SiCl_4$) gas, hexachlorodisilane (HCDS: $Si_2Cl_6$) gas, or the like may be used as the raw material gas, in addition to DCS gas. By supplying these gases to the substrate W, a silicon-containing layer that contains silicon (Si) can be formed on the substrate W. The silicon-containing layer includes halogens in addition to silicon, because the raw material gas contains halogens.

Three zones 24A, 24B, and 24C are established in the fan-shaped region 24 from a side closer to the center of the rotary table 13 toward the peripheral side of the rotary table 13. The gas outlet holes 21 in each of the zones 24A, 24B, and 24C are connected to different gas feeders 27 via different gas passages 25A, 25B, and 25C, respectively. The gas feeder 27 controls a flow rate of DCS gas supplied from a DCS gas source 26 to the gas outlet holes 21. The discharge flow rate of DCS can be controlled in each of the zones 24A, 24B, and 24C. The gas feeder 27 includes, for example, a flow controller for controlling the flow rate of the raw material gas and an open/close valve for opening/closing a flow path of the raw material gas.

The exhaust port 22 is looped around the fan-shaped region 24 so as to surround the fan-shaped region 24. The exhaust port 22 is connected to an exhaust device 28 via an exhaust line. The exhaust device 28 includes a vacuum pump to draw gas. A pressure controller 20 is disposed in the middle of the exhaust line connecting the exhaust device 28 and the exhaust port 22. The pressure controller controls gas pressure at the exhaust port 22. In the following description, the exhaust port 22 may also be referred to as a "first exhaust port 22".

A purge gas outlet 23 is looped around the exhaust port 22 so as to surround the exhaust port 22. The purge gas outlet 23 is connected to the gas feeder 27 for purge gas via a gas flow passage 23A. The gas feeder 27 controls a flow rate of the purge gas fed from a purge gas source 29 to the purge gas outlet 23. The gas feeder 27 may include, for example, a flow controller for controlling the flow rate of the purge gas and an open/close valve for opening/closing the flow path of the purge gas. In a case in which a silicon nitride film is formed by the deposition apparatus, for example, argon gas may be used as the purge gas.

When depositing a film, a raw material gas is discharged from the gas outlet holes 21 and the purge gas is discharged from the purge gas outlet 23. Also, when depositing a film, the raw material gas and the purge gas are exhausted from the exhaust port 22. Accordingly, the first processing region R1 in which the raw material gas is adsorbed to the substrate W can be limited to the area within the loop formed by the exhaust port 22 in a plan view. In addition, it is possible to suppress mixing of the raw material gas fed to the first processing region R1 with gases formed into plasma by the plasma forming units 3A, 3B, and 3C. The purge gas has a role of separating the atmosphere of the first processing region R1 from the external atmosphere, and also has a role of removing excess raw material gas that is adsorbed to the substrate W from the substrate W.

Next, the plasma forming unit 3C will be described with reference to FIG. 1. Because configurations of the other plasma forming units 3A and 3B are similar to the plasma forming unit 3C illustrated in FIG. 1, description of the other plasma forming units 3A and 3B will be omitted.

The plasma forming unit 3C is provided with an opening 11a that vertically penetrates the top plate 12 of the processing vessel 1. The opening 11a is substantially formed in a shape of a fan in a planar view. The opening 11a expands gradually in a circumferential direction of the disc-shaped top plate 12 as approaching a circumference of the disc-shaped top plate 12. A step lib is formed so that a size of the opening 11a is gradually reduced as proceeding downward vertically.

The plasma forming unit 3C generates a plasma by microwave excitation of a plasma forming gas supplied onto the rotary table 13. The plasma forming unit 3C includes an antenna 31 for supplying a microwave. The antenna 31 includes a dielectric plate 32 and a metal waveguide 33.

The dielectric plate 32 is fanned in a shape of a fan in a planar view, to occlude the opening 11a of the top plate 12. The dielectric plate 32 is inserted into the opening lie of the top plate 12, and is supported by the step lib. The dielectric plate 32 is disposed so as to face the rotary table 13. The dielectric plate 32 maintains the interior of the processing vessel 1 airtightly.

The waveguide 33 is provided on the dielectric plate 32, and has an internal space 35 that extends in a radial direction of the rotary table 13. An end of the internal space 35 at a side of the rotational center line 13Z is occluded, and a microwave generator 37 is connected to the other end of the internal space 35 at a side opposite the rotational center line 13Z. The microwave generator 37 supplies a microwave of, for example, approximately 2.45 GHz, to the waveguide 33. The waveguide 33 includes a slot plate 36 that abuts the dielectric plate 32. The slot plate 36 has multiple slot holes 36A.

A microwave supplied to the waveguide 33 reaches the dielectric plate 32 through the slot holes 36A in the slot plate 36, and forms a plasma forming gas into a plasma near a bottom surface of the dielectric plate 32. The fourth processing region R4 in which a plasma is formed can be limited to a region under the dielectric plate 32. The plasma forming gas is supplied to the fourth processing region R4 by a gas feeder 40.

The gas feeder 40 has inner gas outlets 41 and outer gas outlets 42. The inner gas outlets 41 and the outer gas outlets 42 are provided at the step 11b for supporting the dielectric plate 32 from under the dielectric plate 32.

The inner gas outlets 41 discharge the plasma forming gas outwards in the radial direction of the top plate 12, along the bottom surface of the dielectric plate 32. The multiple inner gas outlets 41 are arranged at intervals in the circumferential direction of the top plate 12. The inner gas outlets 41 are connected to an argon gas source 43, an ammonia gas source 44, a hydrogen gas source 45, a fluorine-containing gas source 46, and an oxygen gas source 47, via a main pipe and multiple branch pipes branching from the main pipe. A flow controller 48 is disposed in the middle of each of the multiple branch pipes. The inner gas outlets 41 discharge one or more gases selected from argon gas, ammonia gas, hydrogen gas, fluorine-containing gas, and oxygen gas, in any combination and at any mixing ratio.

Meanwhile, the outer gas outlets 42 discharge the plasma forming gas inwards in the radial direction of the top plate 12, along the bottom surface of the dielectric plate 32. The multiple outer gas outlets 42 are arranged at intervals in the circumferential direction of the top plate 12. Similar to the inner gas outlet 41, the outer gas outlets 42 are connected to the argon gas source 43, the ammonia gas source 44, the hydrogen gas source 45, the fluorine-containing gas source 46, and the oxygen gas source 47, via a main pipe and multiple branch pipes branching from the main pipe. A flow controller 49 is disposed in the middle of each of the multiple branch pipes. The outer gas outlets 42 discharge one or more gases selected from argon gas, ammonia gas, hydrogen gas, fluorine-containing gas, and oxygen gas in any combination and in any mixing ratio. The outer gas outlets 42 are connected to the flow controllers 49 that are different from the flow controllers 48 connected to the inner gas outlets 41, so that the inner gas outlets 41 and the outer gas outlets 42 can discharge the plasma forming gas independently.

An exhaust port 51 is formed at the bottom of the processing vessel 1, as illustrated in FIG. 2. The exhaust port 51 is disposed at a position corresponding to the outside of the rotary table 13 in a plan view, and is disposed on the side opposite the first processing region R1 with respect to the rotational center line 13Z. The exhaust port 51 is connected to an exhaust device 52 via an exhaust pipe. The exhaust device 52 includes a vacuum pump to draw gas. A pressure controller 53 is disposed in the middle of the exhaust pipe connecting the exhaust device 52 and the exhaust port 51. The pressure controller 53 controls the gas pressure at the exhaust port 51. The plasma forming gases discharged from the above-described plasma forming units 3A, 3B, and 3C are expelled from the exhaust port 51. In the following description, the exhaust port 51 may also be referred to as a "second exhaust port 51".

As illustrated in FIG. 1, the deposition apparatus includes a controller 100. The controller 100 is configured by a computer for example, and includes a central processing unit (CPU) 101 and a storage device 102 such as a memory. The storage device 102 stores a program that controls various processes performed in the deposition apparatus. The controller 100 controls an operation of the deposition apparatus by causing the CPU 101 to execute the program stored in the storage device 102. The controller 100 also includes an input interface (I/F) 103 and an output interface (I/F) 104. The controller 100 receives signals from the outside using the input interface 103, and transmits signals to the outside using the output interface 104.

The program may be stored in a computer-readable storage medium, and may be installed in the storage device 102 of the controller 100 from the storage medium. Examples of the computer-readable storage medium include a hard disk (HD), a flexible disk (FD), a compact disc (CD), a magneto-optical disc (MO), and a memory card. Alternatively, the program may be downloaded from a server via the Internet, and the downloaded program may be installed in the storage device 102 of the controller 100.

(Deposition Method)

Figure 5:
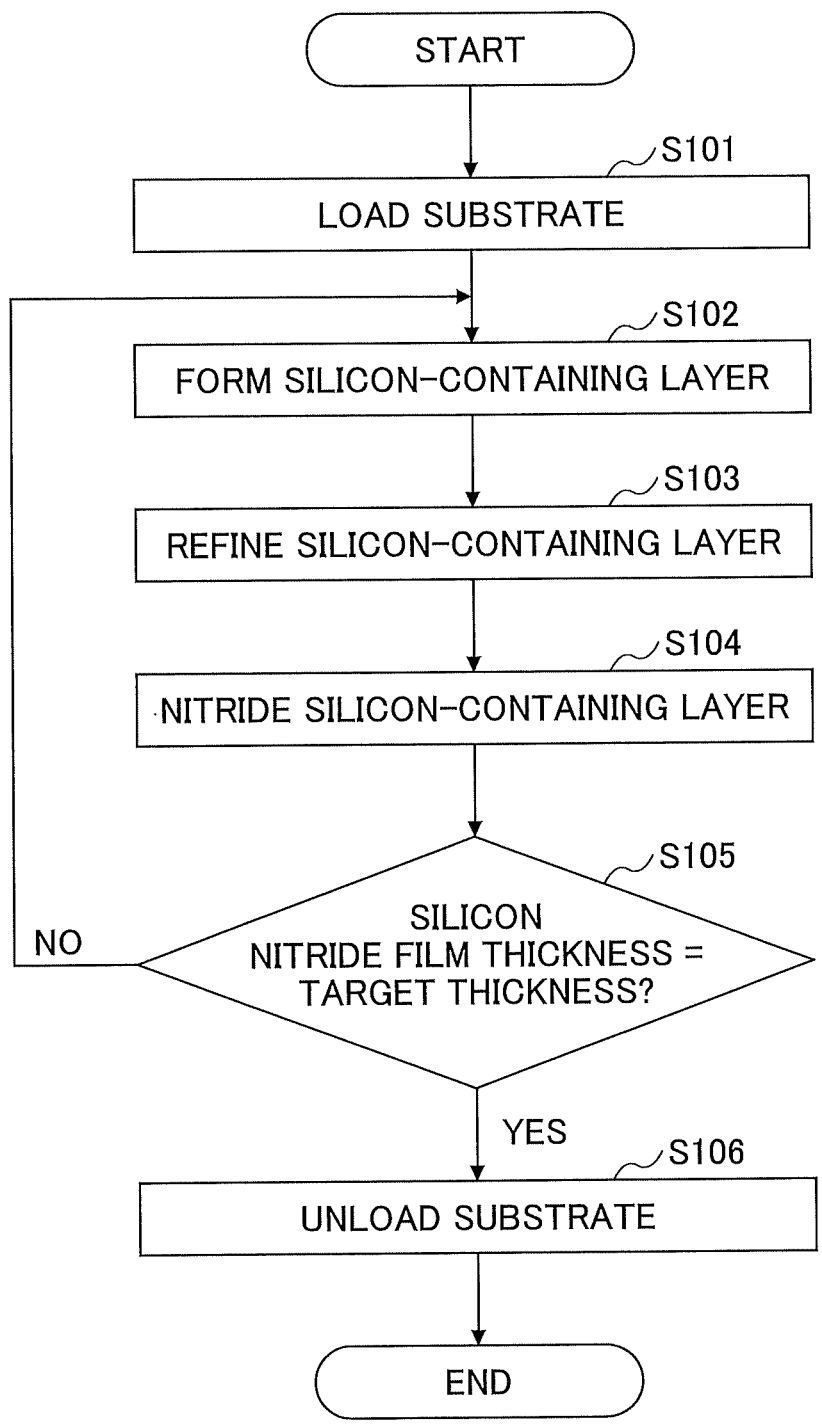
FIG. 5 is a flowchart illustrating a deposition method according to the embodiment.
Figure 6:
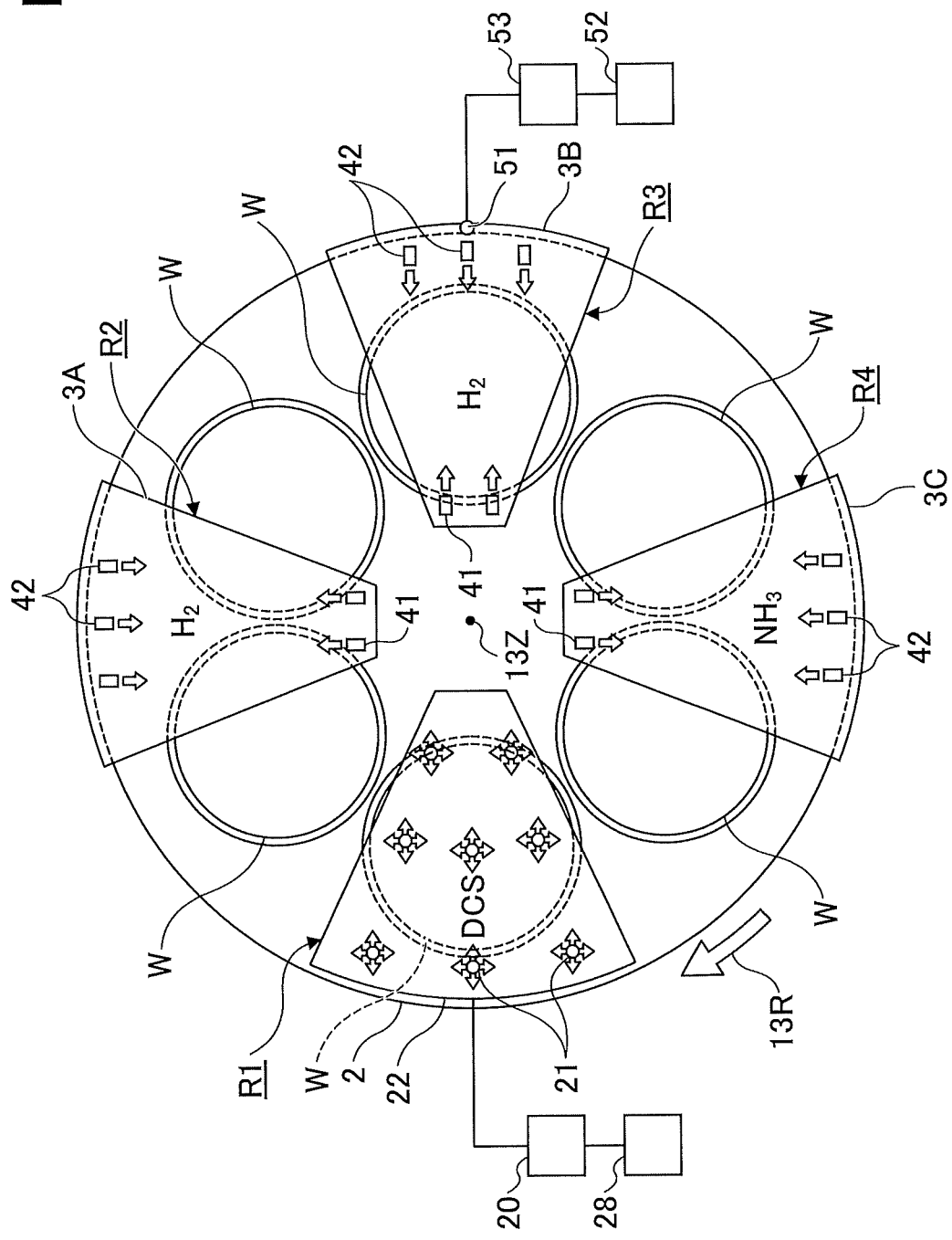
FIG. 6 is a plan view illustrating types of gases supplied onto a rotary table during deposition according to the embodiment.

FIG. 5 is a flowchart illustrating a deposition method according to the present embodiment. Steps S101 to S106 illustrated in FIG. 5 are performed under control of the controller 100. FIG. 6 is a plan view illustrating types of gases that may be supplied onto the rotary table 13 during deposition according to the present embodiment.

The deposition method includes a step of loading a substrate W into the interior of the processing vessel 1 (step S101). In step S101, the gate valve first opens the conveying port 19. Subsequently, the transfer arm passes through the conveying port 19 and stands by above the rotary table 13. Then, the lift pins receive the substrate W from the transfer arm, and place the received substrate W in the recess 14 of the rotary table 13. The transfer of the substrate W from the transfer arm to the rotary table 13 is repeated while the rotary table 13 is intermittently rotated. As a result, for example, six substrates W are loaded on the rotary table 13.

Then, the gate valve closes the conveying port 19. Subsequently, the exhaust device 52 evacuates the interior of the processing vessel 1. When the pressure in the processing vessel 1 reaches a predetermined pressure, the pressure controller 53 controls (maintains) the pressure in the processing vessel 1 to the predetermined pressure. The predetermined pressure that is set (preset) in the pressure controller 53 may be, for example, within a range of 66.5 Pa (0.5 Torr) or more and 665 Pa (5 Torr) or less. Then, the actuator 16 rotates the rotary table 13 at predetermined rotational speed while the heater 17 heats the substrate W to a predetermined temperature. The predetermined rotational speed of the rotary table 13 may be, for example, within a range of 10 rpm or more and 30 rpm or less. The substrate W rotating with the rotary table 13 passes through the first processing region R1, the second processing region R2, the third processing region R3, and the fourth processing region R4 in this order.

The deposition method includes a step of forming a silicon-containing layer on the substrate W by causing the substrate W to adsorb a silicon-containing gas in the first processing region R1 (step S102). For example, DCS gas is used as the silicon-containing gas. The supply and exhaust unit 2 discharges, from the multiple gas outlet holes 21 of the fan-shaped region 24, the silicon-containing gas in a form of a shower, and discharges a purge gas from the loop-shaped purge gas outlet 23 surrounding the fan-shaped region 24 toward the rotary table 13. The supply and exhaust unit 2 also exhausts the silicon-containing gas and the purge gas from the loop-shaped exhaust port 22 that is formed between the fan-shaped region 24 and the purge gas outlet 23.

The deposition method includes a step of refining the silicon-containing layer in the second processing region R2 and the third processing region R3 (step S103). In step S103, the inner gas outlet 41 and the outer gas outlet 42 discharge a refining gas in the second processing region R2 and the third processing region R3. For example, hydrogen gas is used as the refining gas. The refining gas is a plasma forming gas, and is formed into a plasma by the plasma forming units 3A and 3B. The refining gas formed into a plasma refines the silicon-containing layer. The refining of the silicon-containing layer includes, for example, removing halogens contained in the silicon-containing layer. By removing halogens, dangling bonds on Si can be formed. As a result, the silicon-containing layer can be activated and the nitriding of the silicon-containing layer can be promoted.

The deposition method includes a step of nitriding the silicon-containing layer in the fourth processing region R4 (step S104). In step S104, the inner gas outlet 41 and the outer gas outlet 42 discharge a nitriding gas in the fourth processing region R4. For example, ammonia gas may be used as the nitriding gas. The nitriding gas is a plasma forming gas, and is formed into a plasma by the plasma forming unit 3C. The nitriding gas formed into a plasma forms a silicon nitride film by nitriding the silicon-containing layer.

If a thickness of the silicon nitride film is less than a target thickness (NO in step S105), the controller 100 executes step S102 and thereafter again. Whether the thickness of the silicon nitride film reaches the target thickness is determined based on a processing time or the like. Meanwhile, if the thickness of the silicon nitride film reaches the target thickness (YES in step S105), the controller 100 performs step S106.

The deposition method includes a step of unloading the substrate W to the outside of the processing vessel 1 (step S106). In step S106, the gate valve first opens the conveying port 19. Subsequently, the transfer arm passes through the conveying port 19 and stands by above the rotary table 13. The lift pins then receive the substrate W from the rotary table 13 and pass the received substrate W to the transfer arm. The transfer of the substrate W from the rotary table 13 to the transfer arm is repeated while the rotary table 13 is intermittently rotated.

(Cleaning Method)

Figure 7:
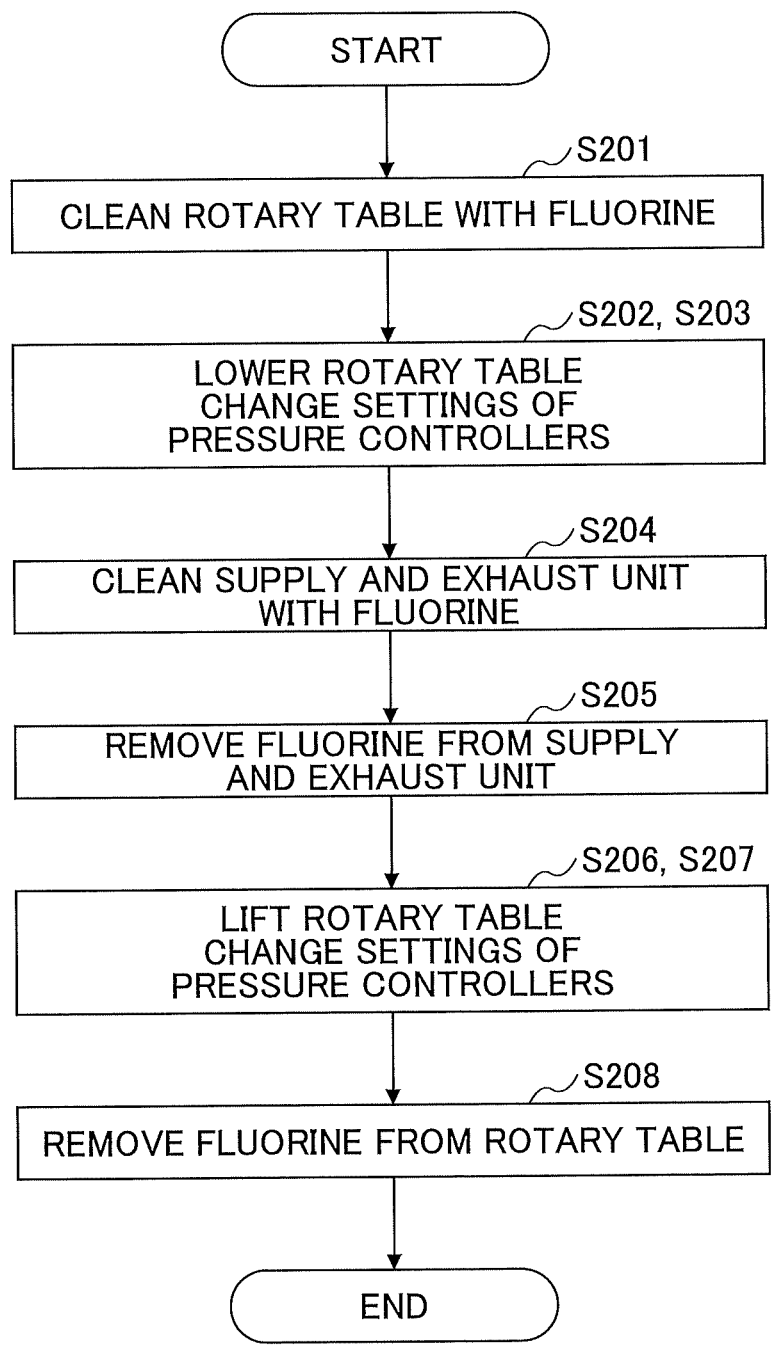
FIG. 7 is a flowchart illustrating a cleaning method according to the embodiment.

FIG. 7 is a flowchart illustrating a cleaning method according to the present embodiment. Steps S201 to S208 illustrated in FIG. 7 are performed under control of the controller 100, and are performed, for example, each time deposition of the silicon nitride film has been performed the predetermined number of times, or each time a predetermined period of time has elapsed. Steps S201 to S208 illustrated in FIG. 7 are performed while the rotary table 13 is rotated by the actuator 16 and while the rotary table 13 is heated by the heater 17. The rotational speed of the rotary table 13 is not particularly limited, for example, 10 rpm. A temperature of the rotary table 13 is not particularly limited, but may be, for example, 550° C.

The cleaning method includes a step of cleaning the rotary table 13 with a cleaning gas formed into a plasma (step S201). The cleaning gas includes a fluorine-containing gas and oxygen ($O_2$) gas. The fluorine-containing gas is, for example, nitrogen trifluoride ($NF_3$) gas. The cleaning gas includes, for example, 1 to 10 vol % of nitrogen trifluoride gas, and 0.5 to 5 vol % of oxygen gas. In the present embodiment, $NF_3$ gas is used as the fluorine-containing gas, but $F_2$ gas may be used instead of $NF_3$ gas. The fluorine-containing gas may be a gas containing fluorine.

The cleaning gas is formed into a plasma, and removes deposits deposited on the rotary table 13. The deposits to be removed are, for example, a silicon nitride film. Meanwhile, the rotary table 13 is formed of, for example, quartz (silicon oxide). Because the cleaning gas includes the fluorine-containing gas and the oxygen gas, the silicon nitride (SiN) can be selectively etched relative to the silicon oxide (SiO).

In the present specification, silicon nitride is denoted by "SiN", regardless of a ratio between silicon (Si) and nitrogen (N). "SiN" includes, for example, a material consisting of silicon and nitrogen in a ratio of 3:4 ($Si_3N_4$). Similarly, in the present specification, silicon oxide is denoted by "SiO", regardless of a ratio between silicon (Si) and oxygen (O). "SiO" includes, for example, a material consisting of silicon and oxygen in a ratio of 1:2 ($SiO_2$).

A mechanism in which the cleaning gas selectively etches SiN relative to SiO is estimated as follows.

The following formula (1) illustrates a reaction formula of $NF_3$ gas formed into a plasma and SiN.

$$SiN + NF_3^* \rightarrow SiF_4 \uparrow \qquad (1)$$

As illustrated in the formula (1) above, SiN reacts with $NF_3$ gas formed into a plasma ($NF_3^*$) to produce $SiF_4$ gas. $SiF_4$ gas is exhausted from the exhaust port 51 and SiN is etched.

The following formula (2) illustrates a reaction formula when $O_2$ gas is added to $NF_3$ gas. Similar to $NF_3$ gas, $O_2$ gas is also formed into a plasma.

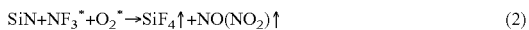

$$SiN + NF_3^* + O_2^* \rightarrow SiF_4 \uparrow + NO(NO_2) \uparrow \qquad (2)$$

As illustrated in the formula (2) above, SiN reacts with $O_2$ gas ($O_2^*$) formed into a plasma, to produce NO or $NO_2$ gas. NO or $NO_2$ gas is exhausted from the exhaust port 51 and SiN is etched.

By adding $O_2$ gas to $NF_3$ gas, NO or $NO_2$ gas is produced in addition to $SiF_4$ gas, thereby increasing an etching rate of SiN. Accordingly, it is assumed that SiN can be selectively etched relative to SiO.

In addition, if $O_2$ gas is added to $NF_3$ gas, oxygen radicals are supplied. As a result, an etching rate of SiO decreases. This is considered to be one of the reasons that the cleaning gas selectively etches SiN relative to SiO. Similar to SiN, SiO reacts with $NF_3^*$ to produce $SiF_4$ gas. In this case, a bond between Si and O is broken, but the oxygen radical ($O^*$) combines with a dangling bond on Si before the fluorine radical ($F^*$) combines with a dangling bond on Si. Thus, the etching rate of SiO apparently decreases.

In a case in which $F_2$ gas is used instead of $NF_3$ gas, the same reaction as in the above-described formulas (1) and (2) occurs.

Because the cleaning gas contains fluorine-containing gas and oxygen gas as described above, silicon nitride (SiN) can be selectively etched relative to silicon oxide (SiO). Accordingly, the cleaning gas can remove a deposited silicon nitride film while suppressing damage to the rotary table 13 made of quartz (silicon oxide).

A quartz member is not limited to the rotary table 13. Because the cleaning gas contains fluorine-containing gas and oxygen gas, a deposited silicon nitride film can be removed from the quartz member while suppressing damage to the quartz member.

The cleaning gas further includes a noble gas such as argon gas, in addition to a fluorine-containing gas and oxygen ($O_2$) gas. By including a noble gas in the cleaning gas, the cleaning gas is more easily formed into plasma.

Figure 8:
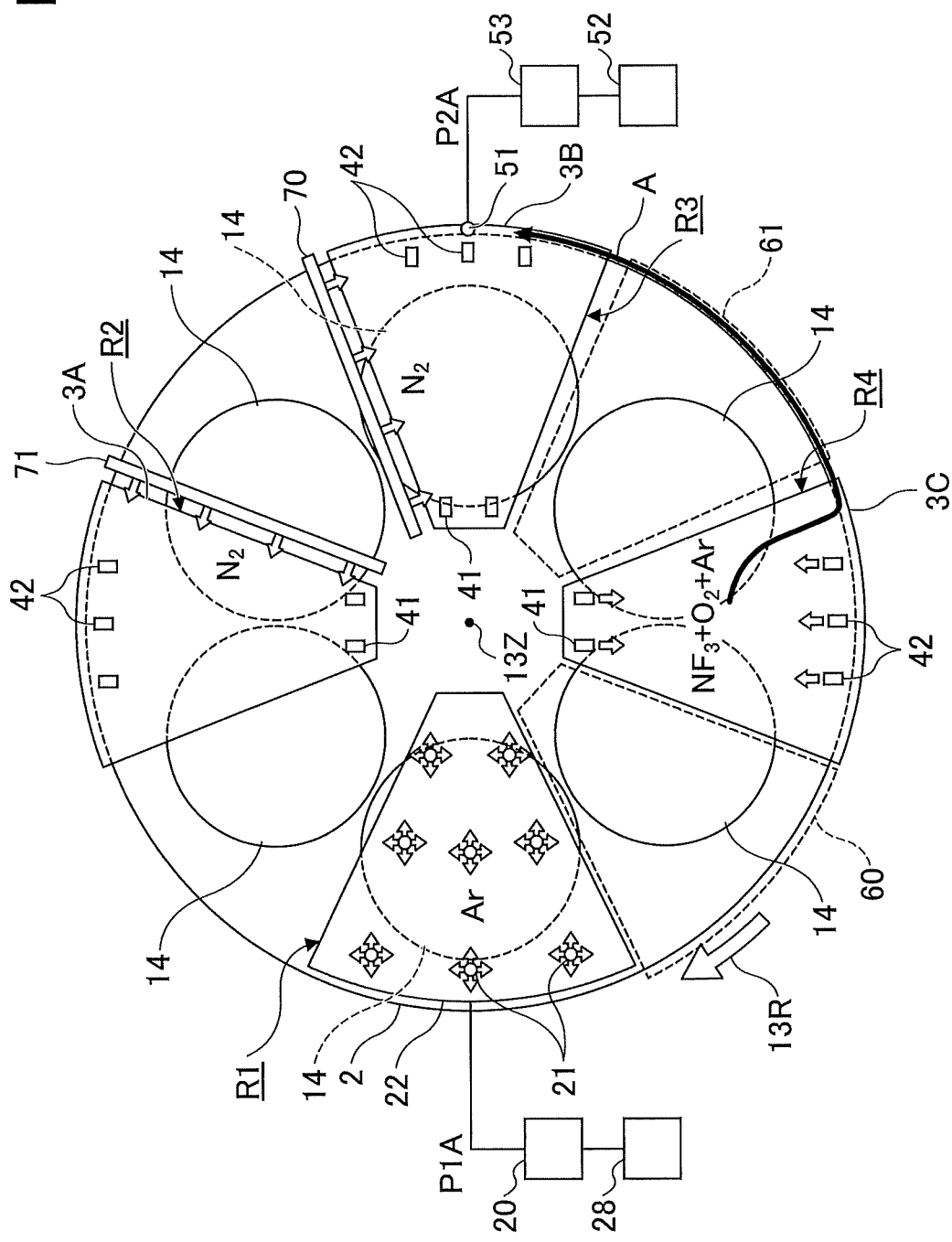
FIG. 8 is a plan view illustrating an example of gases supplied to the rotary table during fluorine cleaning of the rotary table (step S201) illustrated in FIG. 7.
Figure 9:
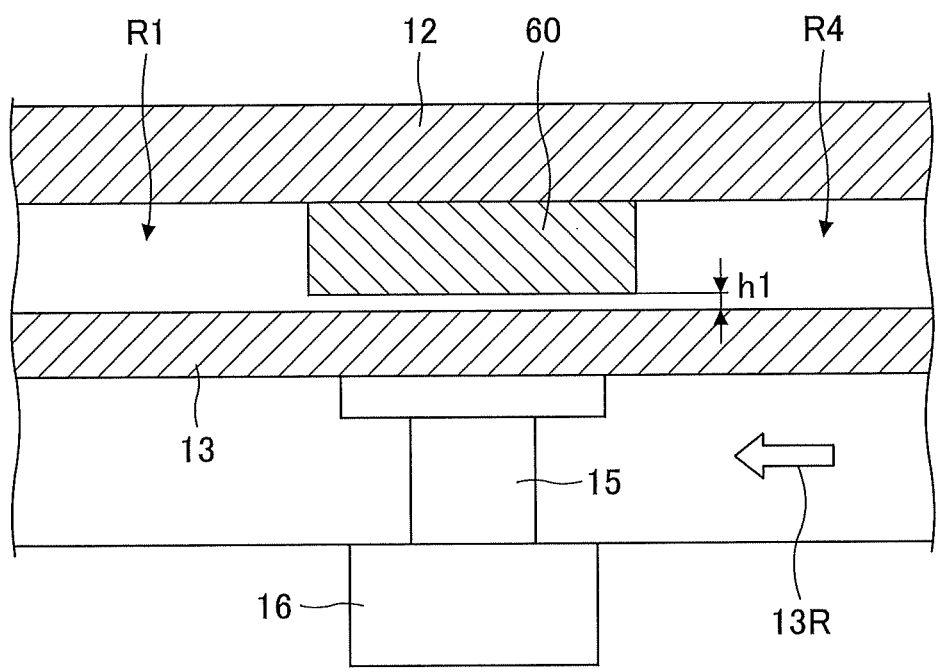
FIG. 9 is a cross-sectional view illustrating an example of a vertical position of the rotary table in the fluorine cleaning of the rotary table (step S201) illustrated in FIG. 7.

FIG. 8 is a plan view illustrating an example of gases supplied to the rotary table 13 in the step of cleaning the rotary table 13 with fluorine (step S201) illustrated in FIG. 7. FIG. 9 is a cross-sectional view illustrating an example of a vertical position of the rotary table 13 in the step of cleaning the rotary table 13 with fluorine (step S201) illustrated in FIG. 7. FIG. 9 is a cross-sectional view of the fourth processing region R4 and the first processing region R1 that is cut along a circumferential direction of the rotary table 13 according to the present embodiment.

As illustrated in FIG. 8, the cleaning gas that is supplied, for example, to the fourth processing region R4, is formed into a plasma by the plasma forming unit 3C, and etches a silicon nitride film. The silicon nitride film deposited on the rotary table 13 is etched by the cleaning gas formed into a plasma, when the silicon nitride film passes through the fourth processing region R4.

In steps S201 to S208 illustrated in FIG. 7, the plasma forming unit 3B does not form a plasma in the third processing region R3. Similarly, in steps S201 to S208 illustrated in FIG. 7, the plasma forming unit 3A does not form a plasma in the second processing region R2.

Above the rotary table 13, the plasma forming unit 3C, a block 60, and the supply and exhaust unit 2 are arranged in this order in a circumferential direction of the rotary table 13, as illustrated in FIG. 8. The plasma forming unit 3C forms the cleaning gas into a plasma. The block 60 faces the rotary table 13 as illustrated in FIG. 9. The upper surface of the rotary table 13 and the bottom surface of the block 60 are formed parallel to each other. The size h1 of a gap between the upper surface of the rotary table 13 and the bottom surface of the block 60 is relatively narrow, which is approximately the same as that during deposition of the silicon nitride film. The block 60 prevents the cleaning gas supplied to the fourth processing region R4 from flowing into the first processing region R1. Thus, the cleaning gas can be concentrated in the fourth processing region R4 to improve efficiency of cleaning with the cleaning gas.

Another block 61 is provided above the rotary table 13, in addition to the block 60, as illustrated in FIG. 8. The two blocks 60 and 61 are arranged such that the plasma forming unit 3C is located between the two blocks 60 and 61 in a circumferential direction of the rotary table 13. The block 61 is disposed between the plasma forming unit 3C and the plasma forming unit 3B. The block 61 is configured similarly to the block 60, and prevents the cleaning gas supplied to the fourth processing region R4 from flowing into the third processing region R3. Thus, the cleaning gas can be concentrated in the fourth processing region R4 to improve efficiency of cleaning with the cleaning gas. In addition, because the cleaning gas can be prevented from flowing into the third processing region R3, an area in which fluorine in the cleaning gas remains can be limited to the fourth processing region R4.

The first exhaust port 22 and the second exhaust port 51 are disposed such that the plasma forming unit 3C is positioned between the first exhaust port 22 and the second exhaust port 51 in the circumferential direction of the rotary table 13. The first exhaust port 22 and the second exhaust port 51 are disposed, for example, such that the first exhaust port 22 is on the side opposite the second exhaust port 51 with respect to the rotational center line 13Z of the rotary table 13, in a plan view. The first exhaust port 22 is formed above the first processing region R1 and is formed in the supply and exhaust unit 2. Meanwhile, the second exhaust port 51 is formed at a position corresponding to the outside of the rotary table 13 in a plan view, and is formed next to the third processing region R3. The gas pressure at the first exhaust port 22 (i.e., the pressure set in the pressure controller 20) is, for example, 0.8 Torr. The gas pressure at the second exhaust port 51 (i.e., the pressure set in the pressure controller 53) is, for example, 1.0 Torr. The gas pressure P1A at the first exhaust port 22 is similar to the gas pressure P2A at the second exhaust port 51.

The cleaning gas is exhausted mainly from the second exhaust port 51, as indicated by an arrow A illustrated in FIG. 8. Argon gas is discharged from the fan-shaped region 24 of the supply and exhaust unit 2 in a form of a shower so that the cleaning gas is exhausted mainly from the second exhaust port 51. The multiple gas outlet holes 21 dispersively arranged on the fan-shaped region 24 discharge argon gas instead of a raw material gas. Because the first exhaust port 22 exhausts the argon gas discharged from the fan-shaped region 24, the cleaning gas is mainly exhausted from the second exhaust port 51 as indicated by the arrow A in FIG. 8.

The flow of the cleaning gas may also be controlled by nozzles 70 and 71 extending in the radial direction of the rotary table 13. Each of the nozzles 70 and 71 includes multiple discharge holes arranged longitudinally at intervals. The discharge holes discharge a counter-gas in a direction perpendicular to the longitudinal direction of a corresponding one of the nozzles 70 and 71. The nozzle 70 is provided, for example, in the plasma forming unit 3B to discharge the counter-gas so as to push the cleaning gas, flowing from the fourth processing region R4 toward the nozzle 70 beyond the second exhaust port 51, back to the second exhaust port 51. The nozzle 71 is provided, for example, in the plasma forming unit 3A to discharge the counter-gas so as to push the cleaning gas, flowing from the fourth processing region R4 toward the nozzle 71 beyond the first exhaust port 22, back to the first exhaust port 22. For example, nitrogen ($N_2$) gas is used as the counter-gas. A noble gas such as argon gas may be used instead of nitrogen gas. The counter-gas may be an inert gas.

Figure 11:
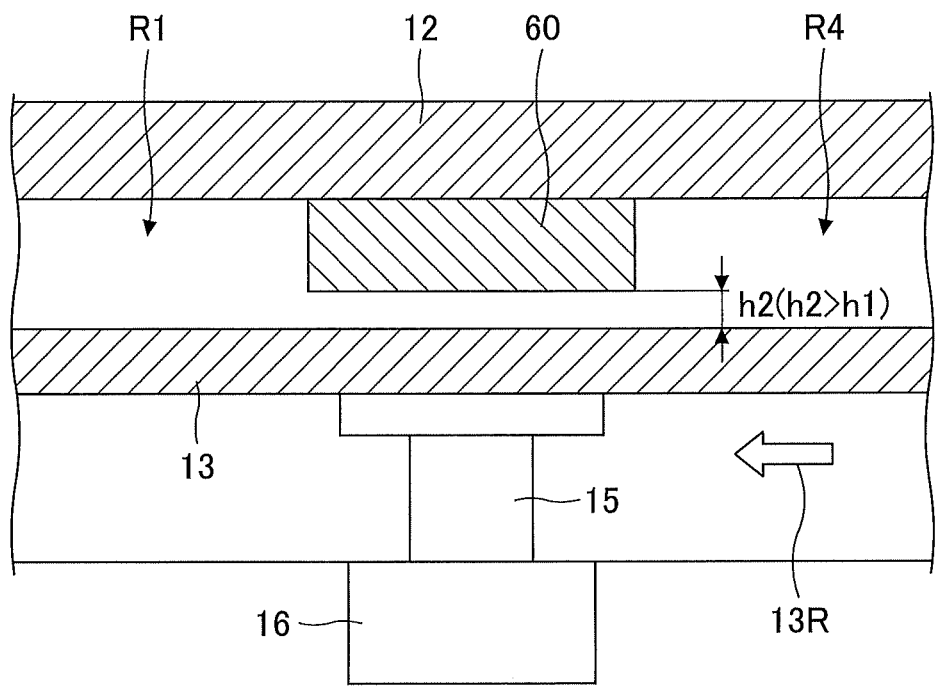
FIG. 11 is a cross-sectional view illustrating an example of a vertical position of the rotary table in the fluorine cleaning of the supply and exhaust unit (step S204) illustrated in FIG. 7.

As illustrated in FIG. 7, the cleaning method includes a step (step S202) of lowering the rotary table 13 from a first position (position illustrated in FIG. 9) to a second position (position illustrated in FIG. 11). The cleaning method also includes a step of changing settings of the pressure controllers 20 and 53 (step S203). The cleaning method further includes a step of cleaning the supply and exhaust unit 2 with the cleaning gas formed into a plasma (step S204). Either the step of lowering the rotary table 13 (step S202) or the step of changing the settings of the pressure controllers 20 and 53 (step S203) may be performed first. Alternatively, both steps S202 and S203 may be performed simultaneously. The downward movement of the rotary table 13 (step S202) and the setting change of the pressure controllers 20 and 53 (step S203) are performed in order to change a cleaning gas flow between the step of cleaning the rotary table 13 with fluorine (step S201) and the step of cleaning the supply and exhaust unit 2 with fluorine (step S204).

Figure 10:
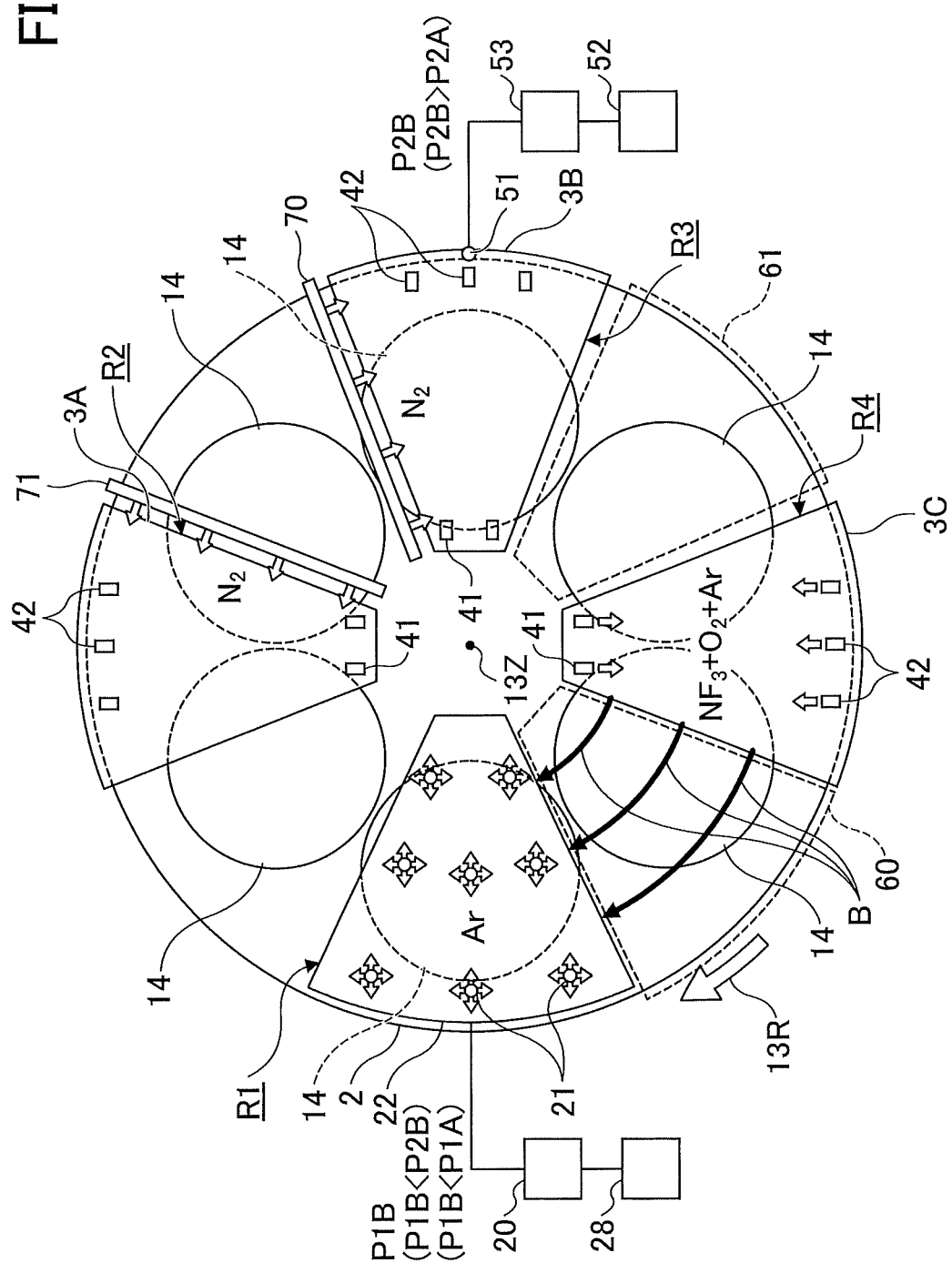
FIG. 10 is a plan view illustrating an example of gases supplied to the rotary table during fluorine cleaning of the supply and exhaust unit (step S204) illustrated in FIG. 7.

FIG. 10 is a plan view illustrating an example of gases supplied to the rotary table 13 in the step of cleaning the supply and exhaust unit 2 with fluorine (step S204) illustrated in FIG. 7. FIG. 11 is a cross-sectional view illustrating an example of a vertical position of the rotary table 13 in the step of cleaning the supply and exhaust unit 2 with fluorine (step S204) illustrated in FIG. 7. FIG. 11 is a cross-sectional view of the fourth processing region R4 and the first processing region R1 that is cut along a circumferential direction of the rotary table 13 according to the present embodiment.

As indicated by arrows B illustrated in FIG. 10, in the step of cleaning the supply and exhaust unit 2 with fluorine (step S204), the cleaning gas formed into a plasma in the fourth processing region R4 mainly flows toward the first exhaust port 22. A silicon nitride film deposited on the supply and exhaust unit 2 can be etched with the cleaning gas, and the silicon nitride film can be removed from the supply and exhaust unit 2.

The vertical position of the rotary table 13 is maintained at the second position (position illustrated in FIG. 11) in order to direct the flow of the cleaning gas mainly toward the first exhaust port 22. A size h2 of the gap between the upper surface of the rotary table 13 maintained at the second position and the bottom surface of the block 60 is greater than the size h1 of the gap between the upper surface of the rotary table 13 maintained at the first position and the bottom surface of the block 60. Accordingly, the cleaning gas supplied to the fourth processing region R4 can easily pass under the block 60. Therefore, the cleaning gas can be caused to flow mainly toward the first exhaust port 22.

In order to cause the cleaning gas to flow mainly toward the first exhaust port 22, the respective gas pressures at the first exhaust port 22 and the second exhaust port 51 in a case in which the vertical position of the rotary table 13 is at the second position are changed from the gas pressures in a case in which the vertical position of the rotary table 13 is at the first position. The gas pressure P1B at the first exhaust port 22 after the vertical position is changed to the second position is lower than the gas pressure P2B at the second exhaust port 51 after the vertical position is changed to the second position. The pressure difference between P1B and P2B causes the cleaning gas to flow primarily toward the first exhaust port 22.

For example, the gas pressure P1B at the first exhaust port 22 when the vertical position of the rotary table 13 is at the second position is lower than the gas pressure P1A at the first exhaust port 22 when the vertical position of the rotary table 13 is at the first position. For example, P1B is 0.3 Torr. Meanwhile, the gas pressure P2B at the second exhaust port 51 when the vertical position of the rotary table 13 is at the second position is higher than the gas pressure P2A at the second exhaust port 51 when the vertical position of the rotary table 13 is at the first position. For example, P2B is 2.3 Torr.

The step of cleaning the supply and exhaust unit 2 with fluorine (step S204) and the step of cleaning the rotary table 13 with fluorine (step S201) may be performed under the same conditions, except for the vertical position of the rotary table 13, the gas pressure at the first exhaust port 22, and the gas pressure at the second exhaust port 51.

As illustrated in FIG. 7, the cleaning method includes a step of removing fluorine adhering to the supply and exhaust unit 2 with a purge gas formed into a plasma (step S205). The step of removing fluorine from the supply and exhaust unit 2 (step S205) is performed after the step of cleaning the supply and exhaust unit 2 with fluorine (step S204). The step of removing fluorine from the supply and exhaust unit 2 (step S205) is performed in the same manner as the step of cleaning the supply and exhaust unit 2 with fluorine (step S204) of the supply and exhaust unit 2, except that the purge gas is supplied instead of the cleaning gas.

Unlike the cleaning gas, the purge gas does not contain a fluorine-containing gas, but contains oxygen ($O_2$) gas. "Purge gas does not contain fluorine-containing gas" means that a content rate of fluorine (F) in the purge gas is not greater than 1 ppm by volume.

Similar to the cleaning gas, the purge gas is supplied to the fourth processing region R4, and is formed into plasma by the plasma forming unit 3C. The purge gas further contains a noble gas such as argon gas in addition to oxygen gas. By including a noble gas being in the purge gas, the purge gas is more easily formed into plasma.

Similar to the cleaning gas, after the purge gas is formed into a plasma, the purge gas flows toward the supply and exhaust unit 2 as indicated by the arrows B in FIG. 10, and removes fluorine adhering to the supply and exhaust unit 2. Because fluorine inhibits deposition of the silicon nitride film when the deposition is restarted, fluorine is removed. Fluorine prevents the silicon-containing gas from adsorbing to the substrate W. Fluorine also prevents the refining gas from refining the silicon-containing layer. According to the present embodiment, because fluorine is removed, a deposition rate of the silicon nitride film can be improved.

Similar to the cleaning gas, the purge gas is mainly exhausted from the first exhaust port 22, as indicated by the arrows B in FIG. 10. Fluorine having been adhering to the supply and exhaust unit 2 is exhausted mainly from the first exhaust port 22 along with the purge gas.

As illustrated in FIG. 7, the cleaning method includes a step (step S206) of raising the rotary table 13 from the second position (position illustrated in FIG. 11) to the first position (position illustrated in FIG. 9). The cleaning method also includes a step of changing the settings of the pressure controllers 20 and 53 (step S207). The cleaning method further includes a step of removing the fluorine adhering to the rotary table 13 with the purge gas formed into a plasma (step S208). Either the raising of the rotary table 13 (step S206) or the setting change of the pressure controllers 20 and 53 (step S207) may be performed first. Alternatively, step S206 and step S207 may be performed simultaneously. The raising of the rotary table 13 (step S206) and the setting change of the pressure controllers 20 and 53 (step S207) are performed in order to change a purge gas flow between the fluorine removal of the supply and exhaust unit 2 (step S205) and the fluorine removal of the rotary table 13 (step S208).

The fluorine removal of the rotary table (step S208) is performed after the step of cleaning the rotary table 13 with fluorine (step S201). The fluorine removal of the rotary table 13 (step S208) is performed in the same manner as the step of cleaning the rotary table 13 with fluorine (step S201), except that the purge gas is supplied instead of the cleaning gas.

Similar to the cleaning gas, the purge gas is supplied to the fourth processing region R4, and is formed into a plasma by the plasma forming unit 3C to remove fluorine adhering to the rotary table 13. Any fluoride having been adhering to the rotary table 13 is removed by the purge gas formed into a plasma, as it passes through the fourth processing region R4.

Similar to the cleaning gas, the purge gas after being formed into plasma is exhausted mainly from the second exhaust port 51, as indicated by the arrow A illustrated in FIG. 8. The fluorine having been adhering to the rotary table 13 is exhausted mainly from the second exhaust port 51, along with the purge gas.

The block 60 prevents the purge gas supplied to the fourth processing region R4 from flowing into the first processing region R1. Similarly, the block 61 prevents the cleaning gas supplied to the fourth processing region R4 from flowing into the third processing region R3. The purge gas can be concentrated in the fourth processing region R4 to improve efficiency of removing fluorine by the purge gas.

As illustrated in FIG. 7, the cleaning method performs the step of cleaning the rotary table 13 with fluorine (step S201), the step of lowering the rotary table 13 (step S202), the step of cleaning the supply and exhaust unit 2 with fluorine (step S204), the step of removing fluorine from the supply and exhaust unit 2 (step S205), the step of raising the rotary table 13 (step S206), and the step of removing fluorine from the rotary table (step S208) in this order. In this case, the cleaning method performs the step of cleaning the supply and exhaust unit 2 with fluorine (step S204) and the step of removing fluorine from the supply and exhaust unit 2 (step S205) consecutively while maintaining the vertical position of the rotary table 13 at the second position. Accordingly, it is possible to reduce the number of times the vertical position of the rotary table 13 is switched between the first position and the second position, thereby reducing processing time.

An execution sequence of the above-described steps S201 to S208 is not limited to the sequence illustrated in FIG. 7. For example, as illustrated in FIG. 12, the cleaning method may perform the step of cleaning the supply and exhaust unit 2 with fluorine (step S204), the step of raising the rotary table 13 (step S206), the step of cleaning the rotary table 13 with fluorine (step S201), the step of removing the fluorine from the rotary table 13 (step S208), the step of lowering the rotary table 13 (step S202), and the step of removing fluorine from the supply and exhaust unit 2 (step S205) in this order. In this case, step S204 is performed while the vertical position of the rotary table 13 is maintained at the second position. Also, in this case, the cleaning method performs the step of cleaning the rotary table 13 with fluorine (step S201) and the step of removing the fluorine from the rotary table 13 (step S208) consecutively while the vertical position of the rotary table 13 is maintained at the first position. Accordingly, again in this case, it is possible to reduce the number of times the vertical position of the rotary table 13 is switched between the first position and the second position, thereby reducing processing time.

The cleaning method illustrated in FIG. 7 or FIG. 12 is performed every time the silicon nitride film has been formed a predetermined number of times, or each time a predetermined period of time has elapsed. In addition, the cleaning method may be performed before the first deposition of a silicon nitride film. That is, the inside of the processing vessel 1 that has not formed a silicon nitride film at all may be cleaned in accordance with the cleaning method of the present disclosure. According to the cleaning method of the present disclosure, an amount of fluorine remaining in the inside of the processing vessel 1 can be reduced, but it is difficult to completely eliminate fluorine. If the cleaning method of the present disclosure is performed prior to the first deposition of a silicon nitride film, a condition, in which a small amount of fluorine remains inside the processing vessel 1 at a time of the first deposition of the silicon nitride film, can be created. Therefore, it is possible to stably perform deposition of silicon nitride films.

Although embodiments of the cleaning method of the deposition apparatus according to the present disclosure have been described above, the present disclosure is not limited to the above-described embodiment. Various changes, modifications, substitutions, additions, deletions, and combinations are possible within the scope of the claims. They are of course within the technical scope of the present disclosure.

For example, the deposition apparatus forms a microwave plasma in the above-described embodiments, but may form an inductively coupled plasma. Also, the deposition apparatus may generate a plasma outside the processing vessel 1 and introduce the generated plasma into the interior of the processing vessel 1.

In the above-described embodiment, the deposition apparatus forms silicon nitride films on multiple substrates W simultaneously. However, the deposition apparatus may form silicon nitride films on each of the substrates W one at a time.

The substrate W is not limited to a semiconductor substrate such as a silicon wafer, and may be a glass substrate or the like.

What is claimed is:

1. A method of cleaning a deposition apparatus, the method comprising:
   cleaning an interior of a processing vessel on which a silicon nitride film is deposited with a cleaning gas formed into a plasma, the cleaning gas including a fluorine-containing gas and oxygen gas, and changing a vertical position of a rotatable rotary table that is disposed horizontally in the processing vessel between a first position and a second position lower than the first position; wherein the cleaning of the interior of the processing vessel includes cleaning the interior of the processing vessel with the cleaning gas formed into the plasma while the vertical position of the rotary table is maintained at the first position; and cleaning the interior of the processing vessel with the cleaning gas formed into the plasma while the vertical position of the rotary table is maintained at the second position, the deposition apparatus includes a plasma forming unit configured to form the cleaning gas into the plasma, a first exhaust port, and a second exhaust port;

the plasma forming unit is disposed above the rotary table;

the plasma forming unit, the first exhaust port, and the second exhaust port are arranged along a circumferential direction of the rotary table in a plan view, such that the plasma forming unit is located between the first exhaust port and the second exhaust port; and the method further comprises changing respective gas pressures at the first exhaust port and the second exhaust port, when the vertical position of the rotary table is changed between the first position and the second position so that a gas pressure at the first exhaust port when the rotary table is at the second position is lower than a gas pressure at the first exhaust port when the rotary table is at the first position, and a gas pressure at the second exhaust port when the rotary table is at the second position is higher than a gas pressure at the second exhaust port when the rotary table is at the first position.

2. The method according to claim 1, wherein, the deposition apparatus includes a plasma forming unit configured to form the cleaning gas into the plasma, a block facing the rotary table, and a supply and exhaust unit configured to discharge and exhaust a silicon-containing gas serving as a raw material gas of the silicon nitride film; and the plasma forming unit, the block, and the supply and exhaust unit are disposed, above the rotary table, along a circumferential direction of the rotary table in an order of the plasma forming unit, the block, and the supply and exhaust unit.

3. The method according to claim 1, wherein the fluorine-containing gas is nitrogen trifluoride gas.

4. The method according to claim 3, wherein the cleaning gas includes 1 to 10 vol % of nitrogen trifluoride gas, and 0.5 to 5 vol % of oxygen gas.

5. The method according to claim 1, further comprising removing fluorine remaining in the interior of the processing vessel with a purge gas formed into a plasma, after the cleaning of the interior of the processing vessel, wherein the purge gas includes oxygen gas and does not include the fluorine-containing gas.

6. The method according to claim 5, further comprising:

changing a vertical position of a rotatable rotary table disposed horizontally in the processing vessel between a first position and a second position that is lower than the first position; wherein the removing of the fluorine includes (a) removing the fluorine remaining in the interior of the processing vessel with the purge gas formed into the plasma while the vertical position of the rotary table is maintained at the first position; and (b) removing the fluorine remaining in the interior of the processing vessel with the purge gas formed into the plasma while the vertical position of the rotary table is maintained at the second position.

7. The method according to claim 6, wherein the cleaning of the interior of the processing vessel includes (c) cleaning the interior of the processing vessel with the cleaning gas formed into the plasma while the vertical position of the rotary table is maintained at the first position, and (d) cleaning the interior of the processing vessel with the cleaning gas formed into the plasma while the vertical position of the rotary table is maintained at the second position; and the changing of the vertical position of the rotary table includes (e) lowering the rotary table from the first position to the second position, and (f) raising the rotary table from the second position to the first position.

8. The method according to claim 7, wherein the method performs steps (a) to (f) in an order of step (c), step (e), step (d), step (b), step (f), and step (a).

9. The method according to claim 7, wherein the method performs steps (a) to (f) in an order of step (d), step (f), step (c), step (a), step (e), and step (b).

* * * * *